US007009193B2

(12) United States Patent
Garza et al.

(10) Patent No.: US 7,009,193 B2
(45) Date of Patent: Mar. 7, 2006

(54) UTILIZATION OF AN ION GAUGE IN THE PROCESS CHAMBER OF A SEMICONDUCTOR ION IMPLANTER

(75) Inventors: Frederico Garza, Richmond, VA (US); Michael Wright, Richmond, VA (US); Karl Peterson, Mechanicsville, VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 95 days.

(21) Appl. No.: 10/697,644

(22) Filed: Oct. 31, 2003

(65) Prior Publication Data

US 2005/0092938 A1 May 5, 2005

(51) Int. Cl.
*G21K 5/10* (2006.01)
(52) U.S. Cl. .............................. 250/492.21; 250/492.3
(58) Field of Classification Search ............ 250/491.1, 250/492.2, 492.21, 492.22, 492.23, 492.1, 250/493.1, 504 R, 492.3; 430/5; 355/71–72, 355/69, 55, 53, 52, 30
See application file for complete search history.

(56) References Cited

U.S. PATENT DOCUMENTS

| 3,278,837 | A | * | 10/1966 | Frederick | 324/462 |
|---|---|---|---|---|---|
| 3,300,163 | A | * | 1/1967 | Randolph | 248/56 |
| 3,576,465 | A | * | 4/1971 | Harvey | 315/102 |
| 4,539,217 | A | * | 9/1985 | Farley | 427/10 |
| 4,587,433 | A | * | 5/1986 | Farley | 250/492.2 |
| 4,680,474 | A | * | 7/1987 | Turner et al. | 250/492.2 |
| 4,743,767 | A | * | 5/1988 | Plumb et al. | 250/492.2 |
| 4,873,833 | A | * | 10/1989 | Pfeiffer et al. | 62/55.5 |
| 4,917,556 | A | * | 4/1990 | Stark et al. | 414/217 |
| 5,093,571 | A | * | 3/1992 | Inomata et al. | 250/288 |
| 5,134,299 | A | * | 7/1992 | Denholm | 250/492.2 |
| 5,306,408 | A | * | 4/1994 | Treglio | 204/192.38 |
| 5,760,409 | A | * | 6/1998 | Chen et al. | 250/492.21 |
| 5,981,955 | A | * | 11/1999 | Wong et al. | 250/423 R |
| 5,981,961 | A | * | 11/1999 | Edwards et al. | 250/492.21 |
| 5,998,798 | A | * | 12/1999 | Halling et al. | 250/492.21 |
| 6,031,240 | A | * | 2/2000 | Kodama | 250/492.21 |
| 6,054,862 | A | * | 4/2000 | Zhou | 324/464 |
| 6,093,625 | A | * | 7/2000 | Wagner et al. | 438/514 |
| 6,137,112 | A | * | 10/2000 | McIntyre et al. | 250/492.21 |

(Continued)

OTHER PUBLICATIONS

Johnson, Ron C. et al., "Dose Reproduciblility in Axcelis GSD Implanters Using Stabil-Ion Gauge", 2002, IEEE, 0-7803-7155-0/02/, pp. 350-352.*

*Primary Examiner*—John R. Lee
*Assistant Examiner*—David A. Vanore
(74) *Attorney, Agent, or Firm*—Staas & Halsey LLP

(57) ABSTRACT

A device to implant impurities into a semiconductor wafer has a process chamber having a wall, a pressure compensation unit, a disk to support a plurality of semiconductor wafers within the process chamber. The disk has a radially extending slot arranged among the wafers. A beam gun is positioned within the process chamber to shoot an ion beam at the semiconductor wafers. A cryo pump minimizes the pressure within the process chamber. A first ion gauge is positioned between the process chamber and the cryo pump. A second ion gauge extends through the wall of the process chamber. A switching device selectively connects the first or second ion gauge to the pressure compensation unit. A faraday receives ions from the ion gun filter after the ions travel through the slot in the disk. A current meter counts the number of electrons flowing to the disk faraday to neutralize the ions.

14 Claims, 11 Drawing Sheets

U.S. PATENT DOCUMENTS

| | | | |
|---|---|---|---|
| 6,160,262 A * | 12/2000 | Aoki et al. | 250/492.21 |
| 6,249,005 B1 * | 6/2001 | Johnson | 250/504 R |
| 6,297,510 B1 * | 10/2001 | Farley | 250/492.21 |
| 6,300,642 B1 * | 10/2001 | Cho et al. | 250/492.21 |
| 6,323,497 B1 * | 11/2001 | Walther | 250/492.21 |
| 6,603,128 B1 * | 8/2003 | Maehara et al. | 250/441.11 |
| 6,639,231 B1 * | 10/2003 | Simmons et al. | 250/492.21 |
| 6,657,209 B1 * | 12/2003 | Halling | 250/492.21 |
| 6,673,673 B1 * | 1/2004 | Yang et al. | 438/255 |
| 6,677,598 B1 * | 1/2004 | Benveniste | 250/492.21 |
| 6,797,336 B1 * | 9/2004 | Garvey et al. | 427/561 |
| 6,797,967 B1 * | 9/2004 | Tse et al. | 250/492.21 |
| 6,831,280 B1 * | 12/2004 | Scherer | 250/492.21 |
| 6,833,314 B1 * | 12/2004 | Maleville et al. | 438/530 |
| 2002/0117615 A1 * | 8/2002 | Overney et al. | 250/282 |
| 2002/0130277 A1 * | 9/2002 | Halling | 250/492.21 |
| 2003/0121887 A1 * | 7/2003 | Garvey et al. | 216/65 |
| 2004/0056210 A1 * | 3/2004 | Scherer | 250/492.1 |
| 2005/0051096 A1 * | 3/2005 | Horsky et al. | 118/723 CB |

* cited by examiner

STANDARD CURVE
(NO BEAM CURRENT ANOMOLIES)

CURVE WITH RESIST OUTGASSING
(EXAGGERATED TO HIGHLIGHT THE EFFECT)

UTILIZATION OF AN ION GAUGE IN THE PROCESS CHAMBER OF A SEMICONDUCTOR ION IMPLANTER

BACKGROUND OF THE INVENTION

Impurities are implanted into semiconductor devices for a variety of reasons, including introducing electrons and holes into the semiconductor substrate in order to locally change the conductive properties of the substrate. For example, silicon has four electrons in the outer ring. Phosphorus has five electrons in its outer ring, one more than silicon. Boron has three electrons in its outer ring, one fewer electron than silicon. Boron can be used to introduce holes into the substrate. Phosphorous can be used to introduce electrons into the substrate.

To enable implantation, the impurities are implanted as ions having one fewer electron than the neutral species. During the implantation process, the electron deficit can be used to determine how much impurity has been implanted. Specifically, it is not possible to accurately count the number of ions (or atoms) leaving the ion gun. Therefore, a predetermined portion of the ions is directed to an ion counter instead of the semiconductor wafer(s). The ion counter may be embodied has a disk faraday. When an ion strikes the disk faraday, an electron is pulled to the disk faraday in order to neutralize the ion. The number of electrons pulled to the disk faraday is counted using a current meter. It is presumed that the number of ions striking in the disk faraday is proportional to the number of ions striking and entering the semiconductor wafer.

The current (electrons per second) represents the rate at which impurities are introduced into the wafer. If the implanter detects that one area of the wafer is receiving impurities at a slower rate than other areas of the wafer, then the implanter spends more time implanting on the deficient area. In this manner, the implanter can work to achieve uniform total dosing across the surface of the wafer.

When the ions hit the semiconductor wafer, they may destroy a portion of a resist layer formed on the wafer. This process releases an outgas into the implant chamber, which would otherwise kept at a very low pressure. Electrons from the outgas can neutralize a portion of the ions, before the ions reach the disk faraday or the semiconductor wafer. Although the ions are neutralized by the resist outgas (rather than being neutralized at the disk faraday or within the semiconductor wafer), the neutral species is still implanted and still causes the desired change to the substrate. However, because the neutral species contains the correct number of electrons, there is not disk faraday current flow for neutralization. Therefore, the neutral species are not counted.

In order to count the impurities implanted as atoms, rather than ions, a pressure sensor is used. As the pressure increases from resist outgassing, it is presumed that a larger percentage of the impurities are introduced into the wafer as atoms rather than ions.

The following equation represents how pressure is taken into consideration to determine the number of ions implanted.

$$I_{DISK} = I_{DOSE} \cdot e^{-KP}$$

In the above equation, $I_{DISK}$ is the current flowing to the disk faraday. This current is proportional to the number of ions implanted. $I_{DISK}$ is the rate at which impurities (ions+ atoms) are implanted. P is the pressure as sensed by the ion gauge/pressure sensor within the device. K is a factor determined by the engineer and input into the implanter. K represents how a pressure change is presumed to effect ion neutralization.

Instead of, or in addition to, the K-factor shown above, a pressure compensation factor P-COMP can be used. The mathematical relationship between K and P-COMP is as follows:

$$P - COMP = 100(e^{K/10000} - 1)$$

or $$K = \ln\left(1 + \frac{P - COMP}{100}\right)(10000)$$

Because K and P-COMP are interchangeable through simple math, the term "pressure compensation factor" is used hereinafter to represent both K and P-COMP with the understanding that the two parameters are interchangeable through the above mathematical relationships.

The process chamber is kept at a very low pressure. By detecting pressure increases, the ion gauge is able to calculate the number of ions within the chamber. The chamber is held at a near-vacuum through cryogenic pumps. The conventional ion gauge is located outside of the process chamber, near a cryogenic pump. However, this location reduces the accuracy of the pressure reading for two reasons. First, resist outgassing causes dramatic increase of pressure near the wafer. This high pressure is localized and drops with distance. At the location of the ion gauge, the pressure has dropped significantly, causing an artificially low pressure reading. Second, the ion gauge is in close proximity to the cryogenic pump, which reduces chamber pressure. The cryogenic pump also reduces the pressure reading of the ion gauge.

With high energy implants, the pressure increase is sufficiently high that the implanter can accommodate the pressure inaccuracies. At the outside chamber location, the ion gauge can accurately sense pressure changes produced by implanting high energy impurities, such as arsenic. That is, the high energy of arsenic causes a lot of resist outgassing, and hence a large pressure increases. By positioning the pressure sensor away from the chamber, near the cryogenic pump, pressure changes are reduced to a range where the ion gauge operates efficiently.

While the conventional position is acceptable for high energy impurities, more recent technologies require lower energy implants that work well with the present system. For example, when nitrogen is implanted, the ion gauge detects very little pressure increase. However, nitrogen implantation causes a substantial amount of resist outgassing and beam neutralization, which are not detected by the ion gauge in its current location. One way to address this deficiency is to use a large K value in calculating pressure compensation. The large K value effectively amplifies the pressure readings of the ion gauge. For example, typical P-COMP values for a high energy impurities such as arsenic range from 8 to 60, depending on the beam current, species and energy. For low energy nitrogen beams, a significantly higher P-COMP value is necessary. Perhaps P-COMP would be in excess of 150.

The above high P-COMP values make ion gauge inaccuracies critical in terms of dose accuracy. A high pressure compensation value exposes the process to a non-acceptable risk of dose error. The risk stems from the pressure read out variability and instability that are inherent in any ion gauge.

Unstable pressure readings lead to varying dose, even when all other variables are perfectly stable. Experience has shown that for very high P-COMP values, it is difficult to repeatedly produce wafers with the same dosing. High P-COMP values introduce wafer-to-wafer variations.

Another approach to addressing the problem is to reduce the beam current until resist outgassing does not significantly affect the process. Specifically, the beam current is reduced to a point that free electrons produced by resist outgassing are consumed by the cryogenic pump(s) as soon as they are released. In this manner, there are not enough electrons to appreciably neutralize the ion beam. However, reducing the beam current lowers the throughput of the implanter and reduces the tool capacity.

SUMMARY OF THE INVENTION

To address these and/or different concerns, the inventors propose a device to implant impurities into a semiconductor wafer. The device has a process chamber having a wall, a pressure compensation unit, a disk to support a plurality of semiconductor wafers within the process chamber. The disk has a radialy extending slot arranged among the wafers. A beam gun is positioned within the process chamber to shoot an ion beam at the semiconductor wafers. A cryo pump minimizes the pressure within the process chamber. A first ion gauge is positioned between the process chamber and the cryo pump. A second ion gauge extends through the wall of the process chamber. A switching device selectively connects the first or second ion gauge to the pressure compensation unit. A faraday receives ions from the ion gun after the ions travel through the slot in the disk. A current meter counts the number of electrons flowing to the disk faraday to neutralize the ions.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1A:
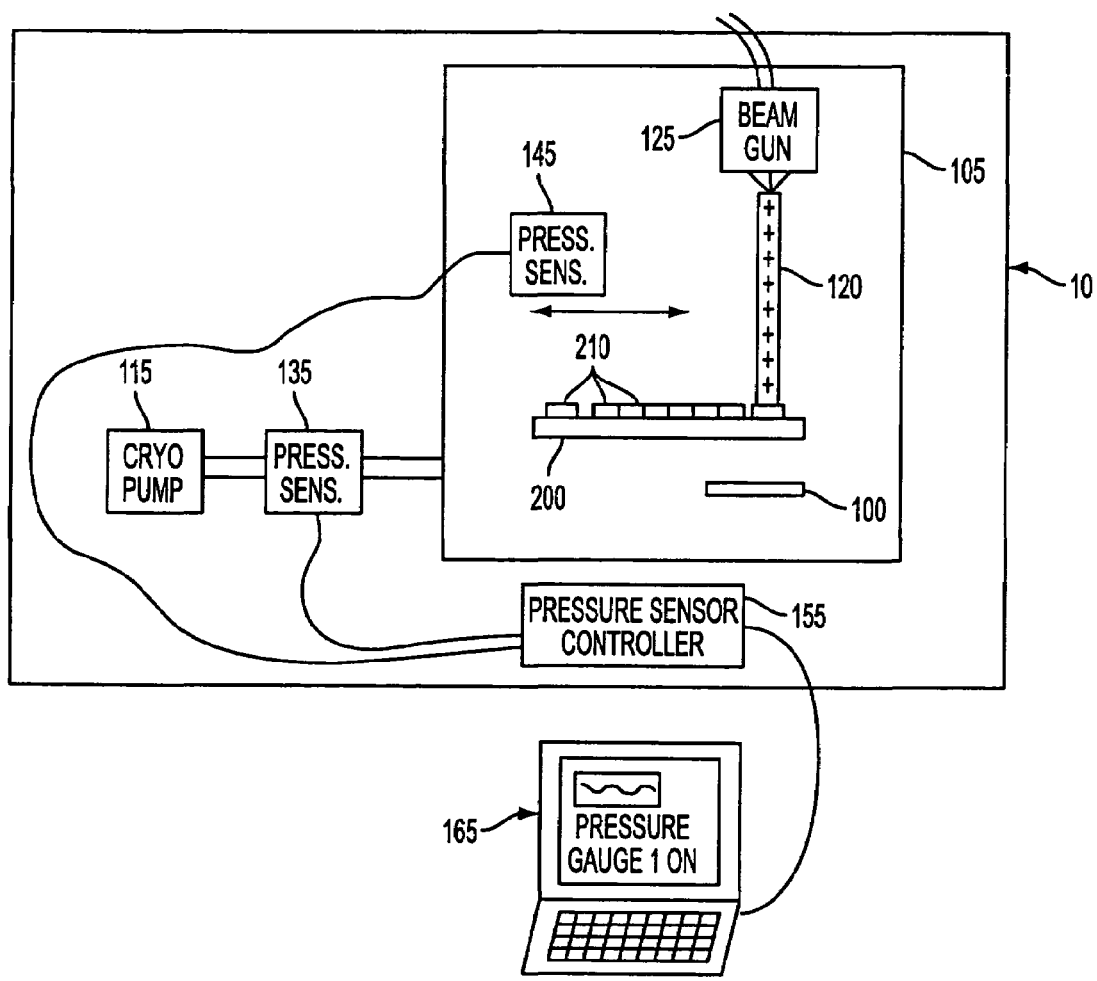
FIG. 1A is a schematic side view of an ion implanter.

Reference will now be made in detail to the preferred embodiments of the present invention, examples of which are illustrated in the accompanying drawings, wherein like reference numerals refer to like elements throughout.

FIG. 1A is a schematic side view of an ion implanter 10. The implanter may be an Axcelis GSD™ platform implanter. The implanter has a chamber 105, which is kept at a very low pressure by cryo pumps, one of which is represented by reference numeral 115. Within the chamber 105, a beam gun 125 produces an ion beam 120 which is focused on wafers 210. The wafers 210 are placed around a disk 200. A faraday 100 is provided under the disk 200 to sense beam current. A first pressure sensor 135 is provided outside of the chamber 105 in the vicinity of the cryo pump 115. This location corresponds with a conventional location and is useful for implanting ions that produce a large pressure response during resist outgassing. A second pressure sensor 145 is provided within the chamber 105. The second pressure sensor (an ion gauge) 145 is useful for the implanting impurities that exhibit a smaller pressure response with resist outgassing. Both the first and second pressure sensors 135, 145 are connected to a pressure sensor controller 155. The pressure sensor controller 155 is in turn connected to a user interface 165. On the user interface 165, the pressure from one of the pressure sensors 135, 145 is displayed together with an indication of which pressure sensor or gauge is being used.

Figure 1B:
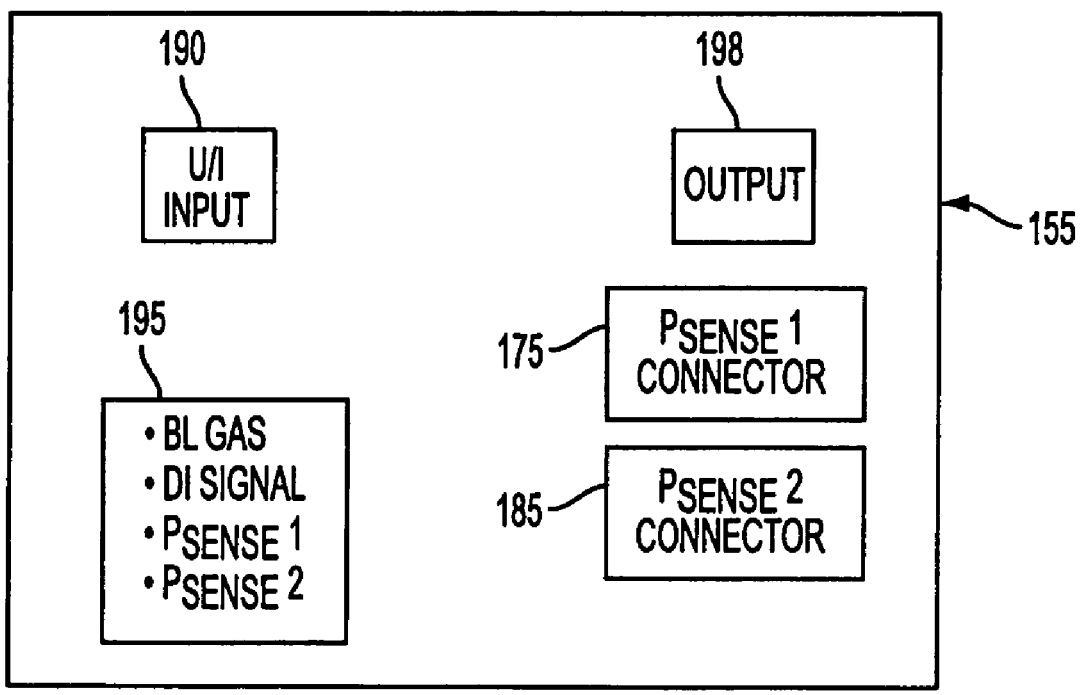
FIG. 1B is a schematic side view of the pressure sensor controller.

FIG. 1B is a schematic side view of the pressure sensor controller 155. Connectors 175, 185 are provided respectively for the first and second pressure sensors 135, 145. Through these connectors 175, 185, the pressure sensors 135, 145 communicate with the pressure sensor controller 155. A user interface input 190 receives information regarding the recipe from the user interface 165. A connector 195 allows various signals within the pressure sensor controller 155 to be manipulated. An output 198 supplies information regarding the detected pressure (or detected number of ions) and information regarding which pressure sensor is active. The information regarding the detected pressure may be provided as an analog output. The information from the output 198 may be provided to the user interface 165 or to a separate display on the implanter 10.

In FIG. 1A an additional ion gauge 145 is added to the implanter 10. This ion gauge 145 is located to close to the wafer 210 such that it can more accurately determine pressure changes. In the process chamber 105, the ion gauge 145 is closer to where resist outgassing, pressure increases and beam neutralization occurs. This placement works well for recipes having a high ratio of beam neutralization to pressure increase.

In order to place the ion gauge 145 within the process chamber 105, a hole is drilled in the process chamber 105. The ion gauge mounting hardware is installed. The ion gauge 145 is installed and connected to the ion gauge controller 155.

Under resist outgassing conditions, the beam current drops due to recombination. Recombination is when an ion is combined with an electron and becomes a neutral atom. The neutral atom is still implanted into the wafer but not counted by the disk faraday of the implanter. Therefore, for every neutralized ion at a specific wafer area, the implanter focuses the beam on the wafer for an additional time long enough to implant one additional ion. This causes an overdose of one ion. The amount of resist exposed to the beam is greatest at the vertical center of the wafer. If pressure compensation is not used, the vertical center of the wafer is overdosed relative to the top and bottom areas of the wafer.

Figure 2A:
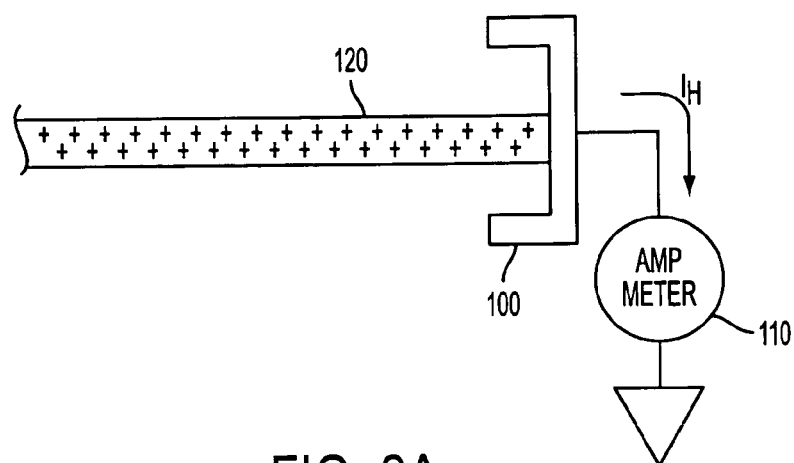
FIG. 2A is a schematic side view of a disk faraday used to determine beam current, which is in turn used to count the number of implanted ions.
Figure 2B:
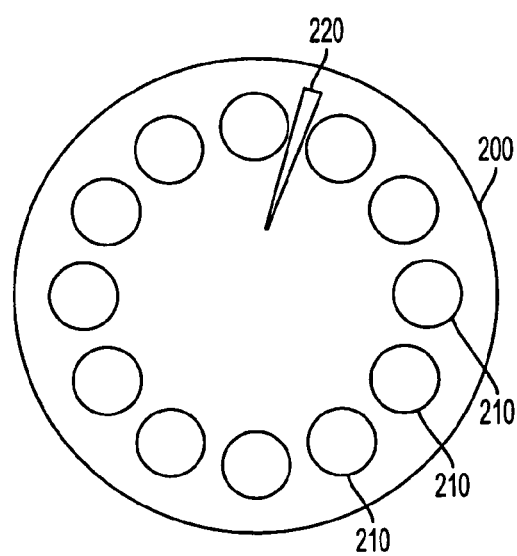
FIG. 2B is a top view of a disk holding a plurality of wafers for implantation.

FIG. 2A is a schematic side view of a disk faraday used to determine beam current, which is in turn used to count the number of implanted ions. FIG. 2B is a top view of a disk holding a plurality of wafers for implantation. In FIG. 2B, a plurality of wafers 210 are arranged on the disk 200. A disk slot 220 is positioned among the wafers 210. An ion gun focuses a beam spot at one point on the wafers 210 as the disk 200 rotates.

Figure 2C:
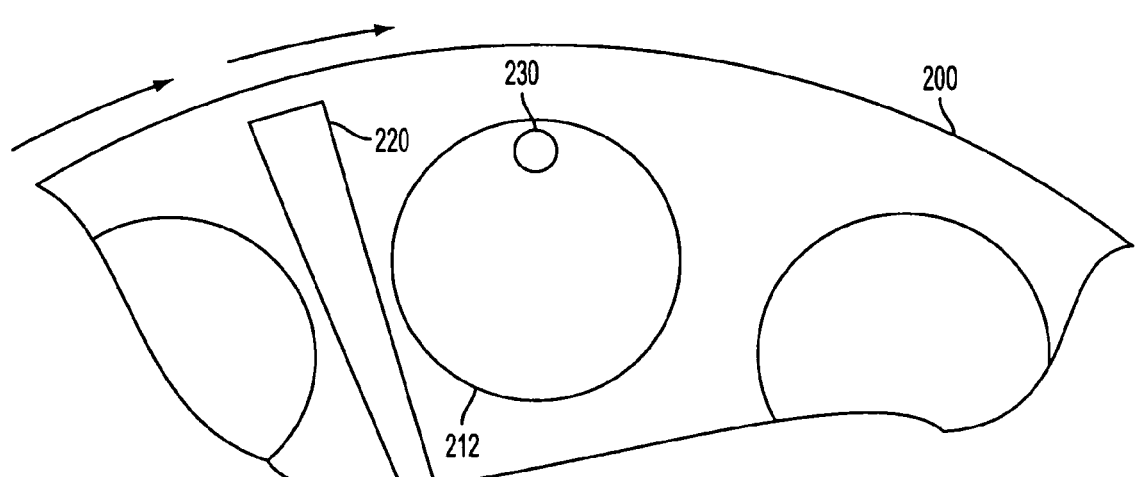
FIG. 2C is an enlarged top view of the disk shown in FIG. 2B.

FIG. 2C is an enlarged top view of the disk shown in FIG. 2B. In FIG. 2C, reference numeral 230 represents a beam spot, where the beam is currently being focused. If the disk 200 is being rotated in a clockwise direction with the beam spot 230 focused as shown, the beam spot 230 will move from wafer to wafer, implanting impurities toward the top of each wafer 210. According to one embodiment, the disk rotates at approximately 1200 rpm. As the disk rotates, a portion of the beam will extend through the disk via the disk slot 220. At this point, the beam spot 230 is directed through the disk 200 to the disk faraday 100 shown in FIG. 2A. The beam 120 contains ions. The disk faraday 100 is grounded. Electrons flow into the disk faraday 100 through a current meter 110 to thereby neutralize each of the ions. The current meter 110 counts the number of electrons, producing a current reading.

Figure 3:
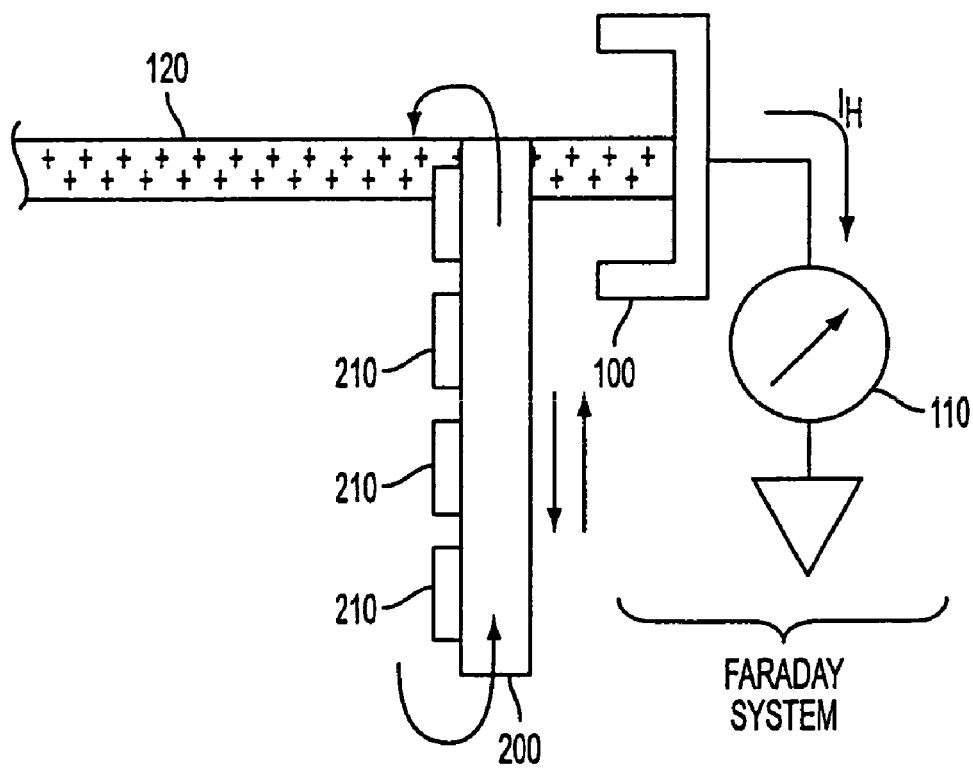
FIG. 3 is a side view of the disk faraday shown in FIG. 2A and the disk shown in FIGS. 2B and 2C.

FIG. 3 is a side view of the disk faraday 100 shown in FIG. 2A and the disk 200 shown in FIGS. 2B and 2C. The disk 200 moves vertically up and down with respect to a horizontally traveling beam 120. This ensures that the beam 120 strikes the complete area of each wafer 210 mounted on the disk. Referring to FIG. 2C, the vertical travel path of the beam is such that the beam travels slightly past the top of the wafer 212 (where it is shown in FIG. 2C). When the beam is slightly above wafer 212, the beam changes direction to travel toward the bottom of the wafer 212. After traveling slightly paste the bottom of the wafer 212, the beam again changes direction so as to head toward the top of the wafer 212. The beam therefore stops and changes directions when the beam is not on the wafer.

The amount of outgassing is proportional to the amount of time that the beam is on the resist, which can be translated to the time the beam spends on the wafer. The beam spends time on the wafer, on the disk slot and the on the disk between, above and below the wafers.

Figure 4:
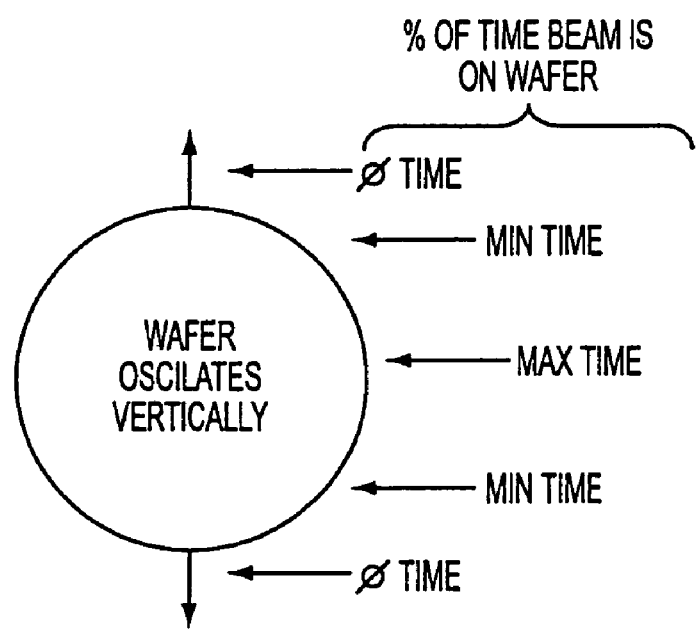
FIG. 4 is a schematic representation of the time spent on the wafer during the beam travel path.

FIG. 4 is a schematic representation of the time spent on the wafers during the beam travel path. When the beam is above or below the wafer, there is no time spent on the wafers. All of the time during the disk rotation is spent on the disk or possibly on the disk slot. When the beam is at the top and bottom of the wafer, there is a minimum time spent on the wafer. During each revolution of the disk 200, the beam 220 spends most of its time on the disk 200, rather than on a wafer 210. At the middle of the wafer, the beam spends the maximum time on the wafer.

Figure 5:
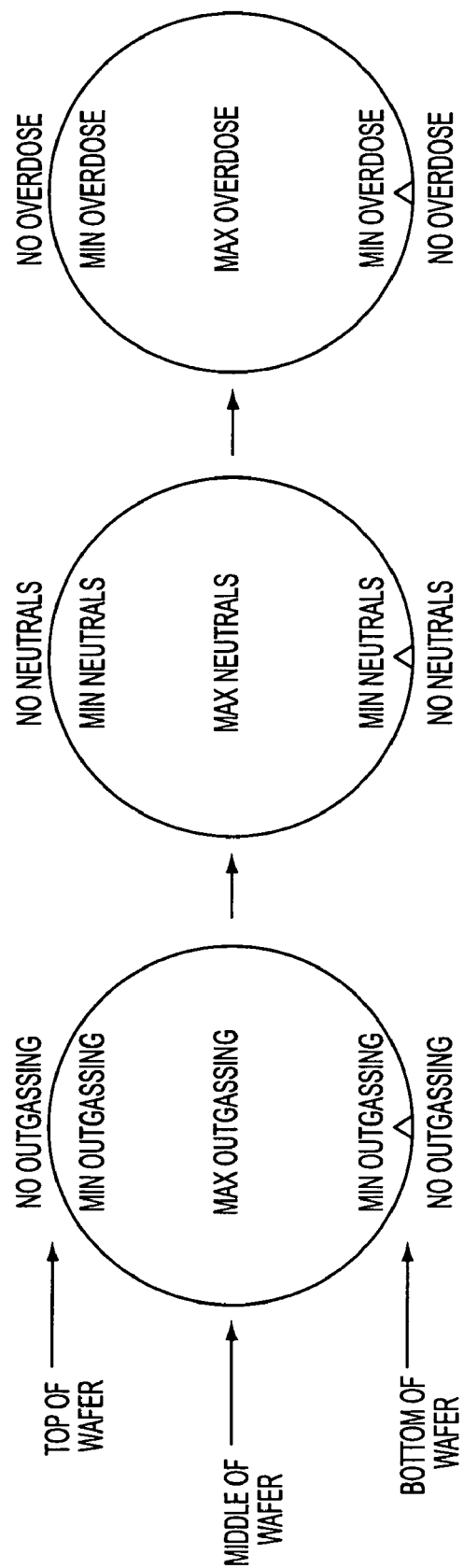
FIG. 5 shows the correlation between the time the beam spends on the wafer at various disk positions, the amount of outgassing, the number of neutral species implanted and the amount of overdose if the neutral species are ignored in the calculations.

FIG. 5 shows the correlation between the time the beam spends on the wafer at various disk positions (FIG. 4), the amount of outgassing, the number of neutral species implanted and the amount of overdose if the neutral species are ignored in the calculations. When the beam is at the center of the wafer, there is more outgassing and beam neutralization. The current meter 110 detects fewer implanted ions. Without accounting for the neutralized atoms, the disk moves more slowly when the beam is focused at the center of the wafer. This allows the beam to implant more ions on the center of the wafer. Because the implanted neutralized atoms are ignored, this results an overdose in the center of the wafer.

Figure 6:
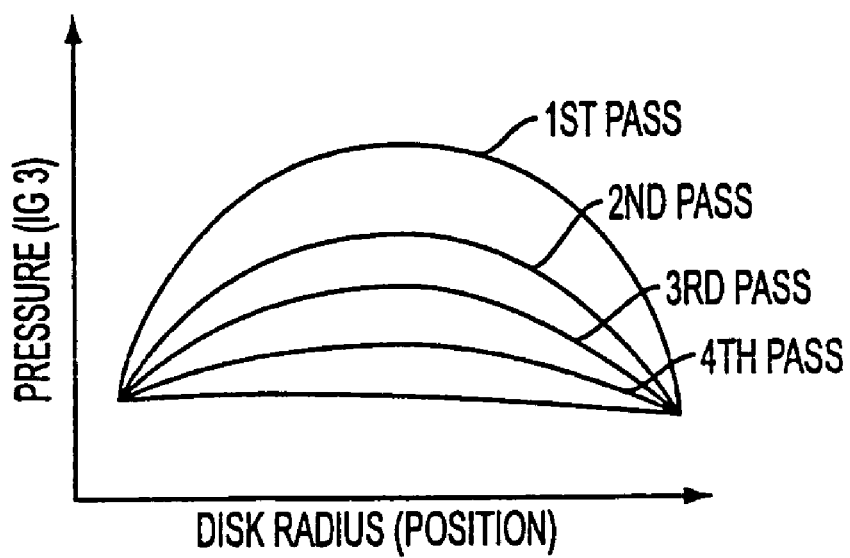
FIG. 6 is a plot of mean sheet resistance versus P-COMP values for a conventional method of determining a P-COMP value.
Figure 7:
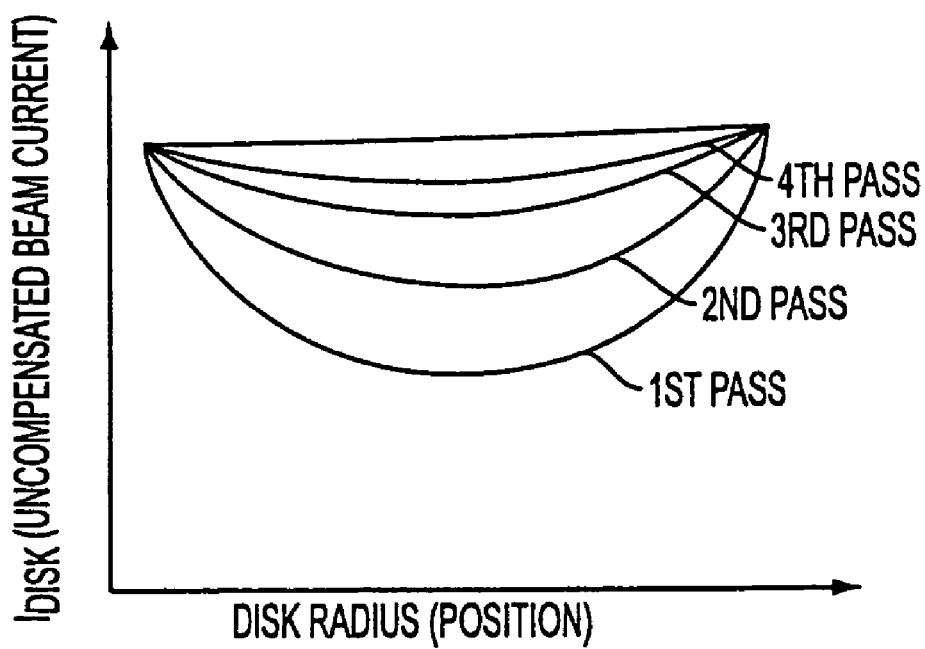
FIG. 7 shows an X-Y plot of the uncompensated beam current $I_{DISK}$ as a function of disk radius.

At the beginning of the implantation process, there is more resist to be burnt. There is therefore more resist outgassing at the beginning of the implantation process than at the end of the implantation process. Pressure is proportional to the amount of outgassing. FIG. 6 is an X-Y plot of outgassing as a function of disk radius. As can be seen, the largest pressure increase happens on the first pass of the ion beam over the wafer. There is less of a pressure increase with each succeeding pass. For each pass, the pressure increase is greatest at the center of the wafer. It should be noted that the beam may be traveling in opposite directions for each succeeding pass. For example, the first pass may be a downward pass, the second pass may be an upward pass, the third pass may be a downward pass, and so on. The outgassing is reduced with the each pass due to the decreasing availability of hydrogen and resist solvents in the organic resist. This is known as resist conditioning. FIG. 7 shows an X-Y plot of the uncompensated beam current $I_{DISK}$ as a function of disk radius. FIG. 7 represents the current detected by the disk faraway. Comparing FIGS. 6 and 7, it can be seen that when there is maximum outgassing, the disk faraday detects the minimum current. This is because the outgassing causes the ions to recombine before implantation.

The dose system controls the vertical disk speed. It attempts to minimize vertical dose non-uniformity by changing the vertical disk speed in response to changes in the measured beam current $I_{DISK}$. A drop in measured beam current causes the vertical disk speed to decrease at that vertical position so that an underdosing situation does not occur. The vertical disk speed may be varied while maintaining the same disk rotational speed. If the beam current drop is "legitimate" meaning it is caused by something that effects the number of implanted impurities (ions plus atoms), then dose uniformity is optimized by the vertical speed reduction. If the beam current drops due to beam neutralization, then overdosing occurs at the vertical position on the wafer that is being hit by the beam when the speed reduction occurs. Pressure changes are considered in order to differentiate between legitimate current drops and neutralization current drops. With the following equation, $I_{DISK}$ to control vertical disk speed:

$$I_{DISK}=I_{DOSE} \cdot e^{-KP}$$

For one revolution of the disk, the relative area struck by the beam spot is related to the circumference. That is, the closer the beam is to the center of the disk (not center of the wafer), the less area (wafers plus exposed disk) that is covered by the beam spot during each revolution. As the beam spot gets further towards the outer periphery of the disk, more area (wafers plus exposed disk) is covered during each revolution.

Since the area changes for a given disk position and the disk rotational speed does not change, the horizontal speed of the beam over the outer areas disk is greater. Toward the outer portions of the disk, fewer impurities are implanted per area for each rotation. To compensate for this and to ensure dose uniformity, the vertical speed of the disk changes.

Figure 8A:
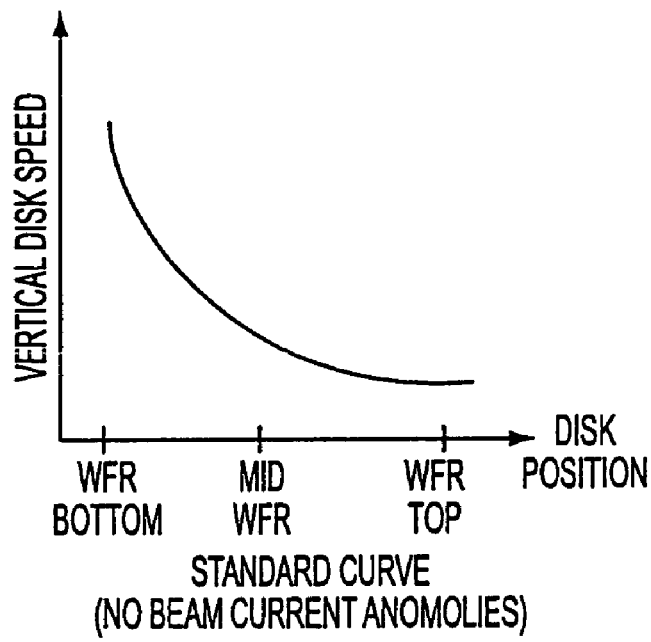
FIG. 8A is a plot of vertical disk speed versus disk position.

FIG. 8A is a plot of vertical disk speed versus disk position. The vertical speed is slowest towards the top of the wafer, where the horizontal disk speed is greatest. A slower vertical disk speed effectively allows the beam to implant on a given area for more revolutions the disk.

Figure 8B:
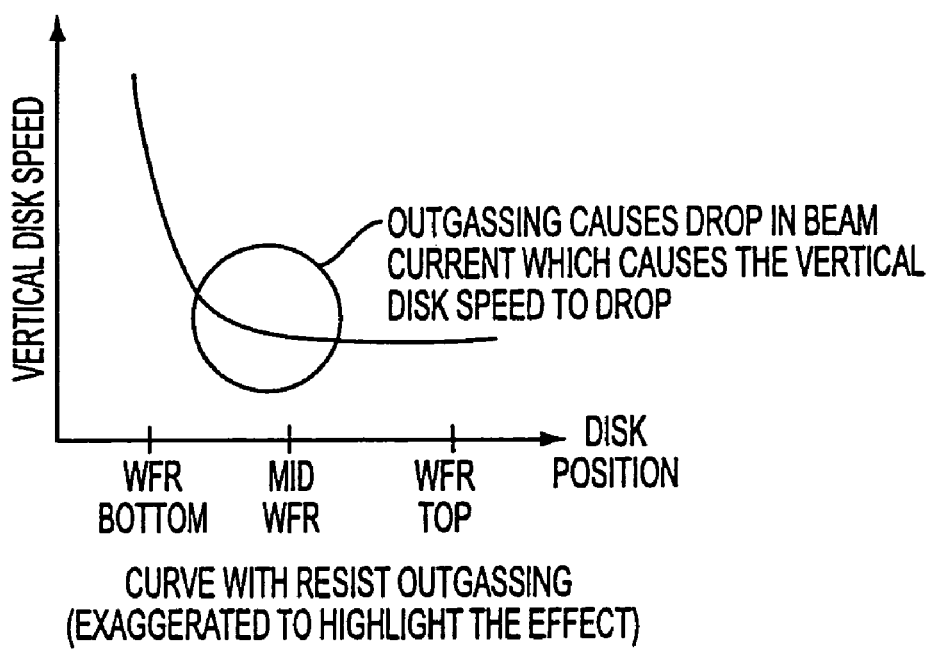
FIG. 8B is a plot of vertical disk speed versus disk position when outgassing causes a drop in beam current.

FIG. 8B is a plot of vertical disk speed versus disk position when outgassing causes a drop in beam current. The flat portion of the curve shown in FIG. 8B demonstrates that when there is outgassing toward the middle of the wafer, the vertical disk speed is slower than would otherwise be necessary.

Figure 9:
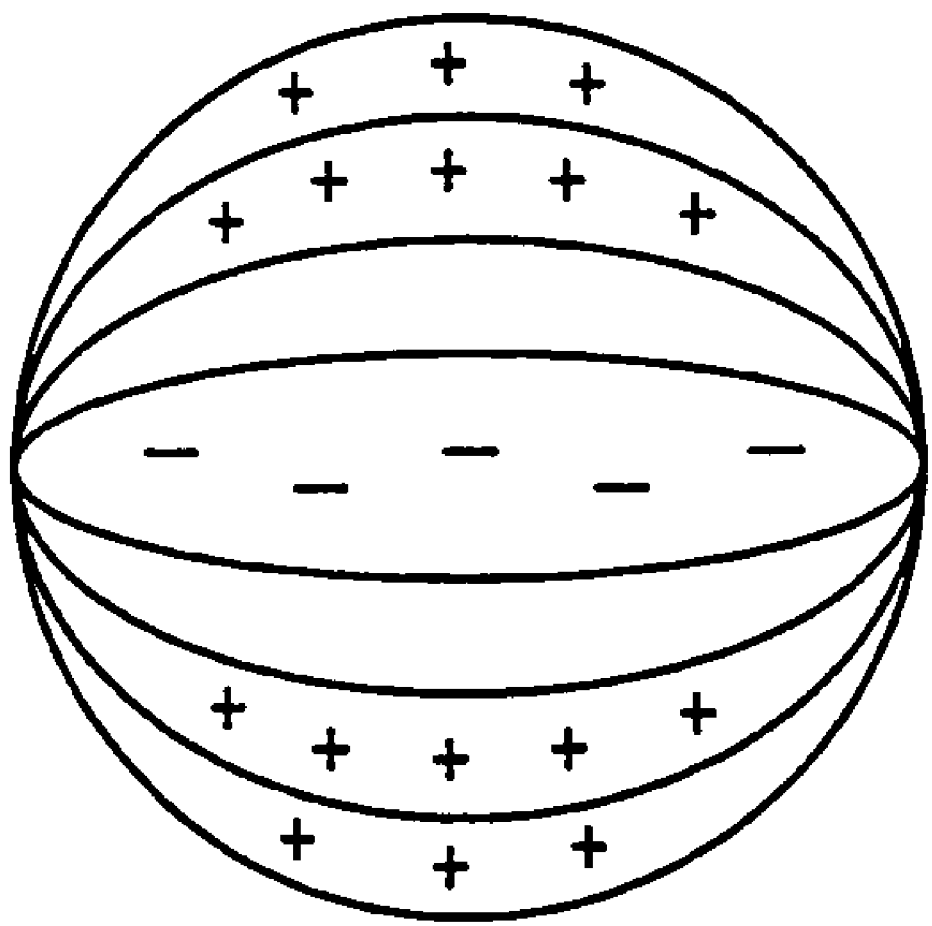
FIG. 9 is a sheet resistance map for an a non-uniformly dosed wafer.

FIG. 9 is a sheet resistance map for a non-uniformly dosed wafer. Towards the middle of the wafer, the sheet resistance is less than the average sheet resistance. This indicates that there is overdosing toward the middle of the wafer. The sheet resistance of FIG. 4 can be obtained through testing, by placing probes at different positions on the wafer.

Some implanters minimize dose non-uniformity by ignoring beam current fluctuations. This can be done, for example, by not monitoring the beam current during "beam-on-wafer" time periods. That is, a disk faraday is not used during implanting. However, if there is a problem upstream from the wafer during implanting, which cases fewer impurities to enter the wafer, then this problem cannot be recognized. Alternatively, non-uniformity can be minimized by increasing the capacity of the cryo pumps. With more powerful pumps, the resist outgassing electrons are sucked into the cryo pumps as they are released. The inventors, however, are avoiding non-uniformities with pressure compensation and the formula below.

$$I_{MEASURED} = I_{DOSE} \cdot e^{-KP}$$

$I_{MEASURED}$ is also referred as $I_{DISK}$, and is current detected by the disk faraday. $I_{DOSE}$ is the corrected dose current. The K-factor, which is input by the operator, either magnifies or diminishes the effect of pressure on the corrected dose current $I_{DOSE}$. If K is large, then an inaccuracy in $I_{MEASURED}$ produces a large inaccuracy in the compensated beam current $I_{DOSE}$ While K should be high enough to assure cross wafer dose uniformity, a small K is better in terms of dealing with noise from the pressure sensor and avoiding inaccuracies.

Figure 10A:
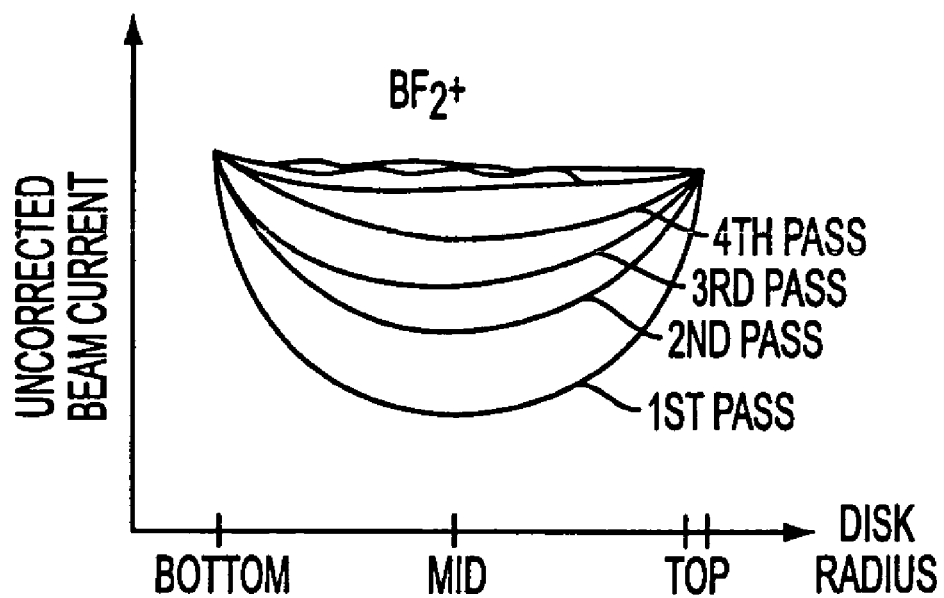
FIGS. 10A and 10B are plots of beam current and pressure versus disk position for a higher energy implant.
Figure 10B:
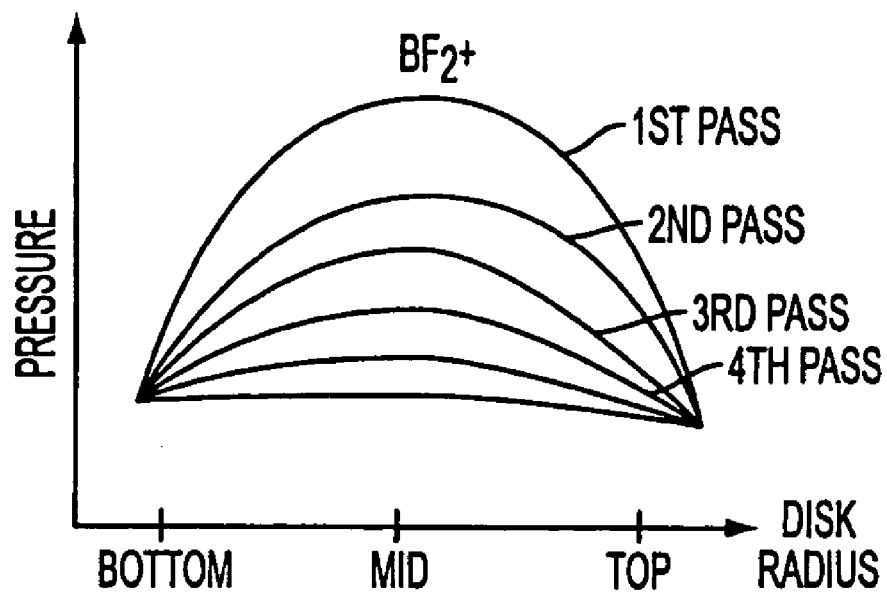

FIGS. 10A and 10B are plots of beam current and pressure versus disk position for a higher energy implant. The pressure readings for FIG. 10B were produced by an ion gauge at the conventional position. In FIG. 10A, the uncorrected beam current is plotted versus disk position. The uncorrected beam current is the current that is detected through the disk faraday. The bottom curve in FIG. 10A shows that for the first pass across the wafer, there is the greatest drop in beam current. This can be explained by reviewing FIG. 10B which shows that the pressure increase is greatest on the first pass over the wafer. On the first pass, there is maximum resist outgassing, which causes the pressure increase and introduces free electrons into the chamber in the vicinity of the wafer. The electrons cause ion beam neutralization and hence a drop in the detected current. Because of the significant pressure response detected, a smaller P-COMP value is sufficient to compensate for beam neutralization.

Figure 11A:
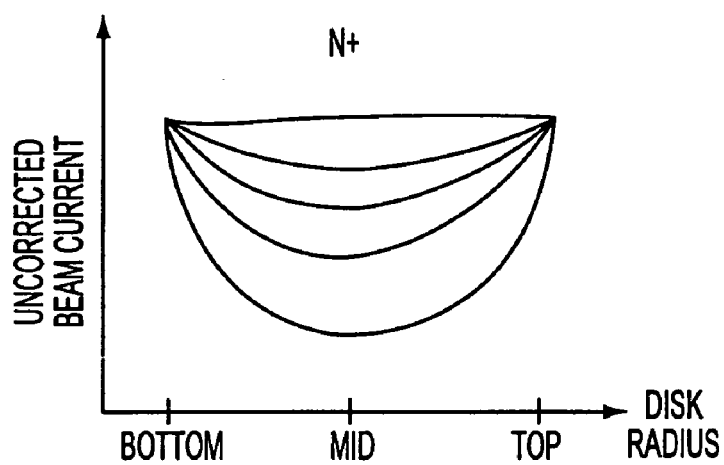
FIGS. 11A and 11B are plots of uncorrected beam current and pressure versus disk position for a lower power implants such as nitrogen.
Figure 11B:
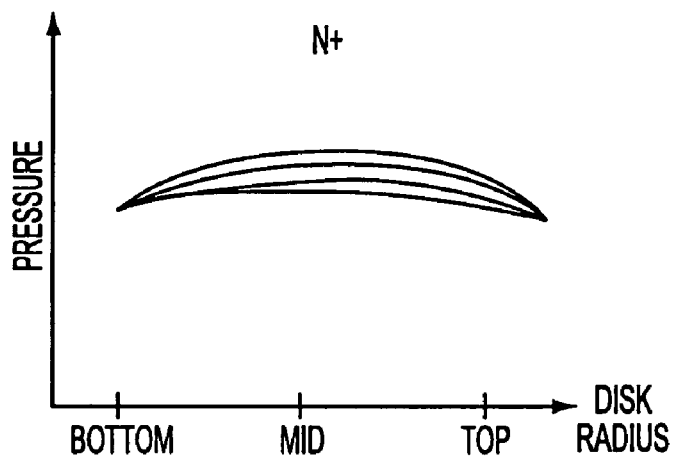

FIGS. 11A and 11B are plots of uncorrected beam current and pressure versus disk position for a lower power implant such as nitrogen. Again, the beam current is the beam current detected by a disk faraday. Like FIG. 10B, the pressure readings for FIG. 11B were produced by an ion gauge at the conventional position. As can be seen, significant beam neutralization (current drop) only produces small changes in the pressure reading. A very high P-COMP value is necessary in order to flatten out the beam current ($I_{DOSE}$) versus disk position curve.

Figure 11C:
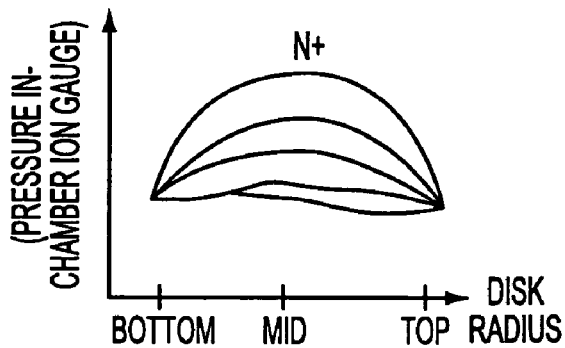
FIG. 11C is a plot of pressure versus disk radius using an ion gauge located within the process chamber.

The reason for this phenomenon is not yet fully understood. It could be that, under similar process conditions other than impurity species, low energy implants, such as $N^+$, are much more likely to accept an electron (neutralization) than $BF_2^+$, $P^+$, or $AS^+$. This would result in excessive/greater beam current drop, as a function of pressure. Conditional P-COMP systems and ion gauges, while being very accurate for other (high energy) implant processes, are not sufficient for $N^+$. One solution to this problem is to increase the ion gauge response in order to bring it up to the magnitude with which the implanter works. In order to achieve this, pressure must be monitored close to where the resist outgassing occurs. Conventional ion gauges resides upstream of the beam gate, outside of the process chamber, next to the cryo pump. This location is too far from the outgassing source (and too close to the cryo) to detect more subtle pressure fluctuations. Placing the pressure monitor in the process chamber results in the pressure response shown in FIG. 11C, which is another plot of pressure versus disk radius. Unlike FIGS. 10B and 11B, the pressure readings for FIG. 11C were produced by an ion gauge located within the process chamber. Comparing FIG. 11C with FIG. 11B, it can be seen that if the ion gauge is located within the process chamber for low energy implants, a sufficient pressure response is produced.

Placing an ion gauge in the process chamber results in much smaller P-COMP values than an ion gauge placed at the conventional location. For example, a P-COMP of 7 is possible instead of a P-COMP in excess of 150. This is a dramatic improvement as it drastically reduces dose inaccuracies/functuations and increases dose repeatability by reducing the affect of ion gauge inaccuracies.

Placing an ion gauge in the process chamber, while desirable for low energy impurities, such as $N^+$, makes the pressure readings unacceptable for the other processes such as high energy implants. Therefore, the ion gauge within the process chamber does not replace the ion gauge located downstream, toward a cryo pump. Both ion gauges should be installed. Depending on the process/recipe, the operator should switch between the ion gauges.

An alternate solution is to place two ion gauges within the process chamber. The first ion gauges should be a highly sensitive ion gauge, which accurately detects pressures below a given threshold, perhaps $1 \times 10^{-4}$ Torr. A second ion gauge is positioned within the process chamber, perhaps at the same general location as the first pressure gauge. The second ion gauge is less sensitive than the first ion gauge. For example, the second ion gauge can detect pressures above the given threshold, perhaps $1 \times 10^{-4}$ Torr. The first ion gauge is used for low energy implants, and the second ion gauge is used for high energy implants.

Figure 12:
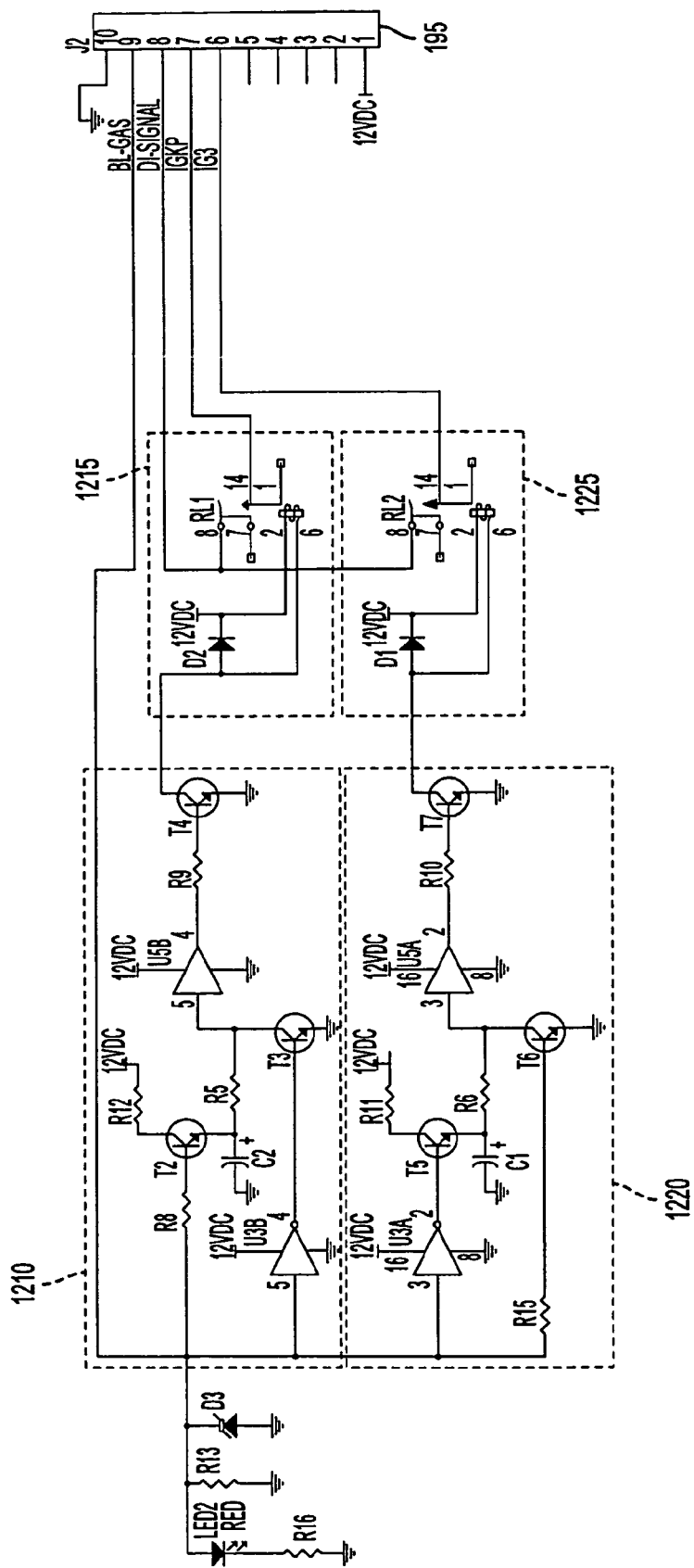
FIG. 12 is a schematic view of a switching circuit to switch between the first and second ion gauges (pressure sensors) shown in FIG. 1A.

FIG. 12 is a schematic view of a switching circuit to switch between the first and second ion gauge (pressure sensors) shown in FIG. 1A. FIG. 12 shows the connector 195 of the pressure sensor controller 155 shown in FIGS. 1 and 2. Pin number 9 is a beam line gas signal. Beam line gas is a parameter that serves to focus the beam on the wafer. The beam line gas is a parameter that may not be used for either high energy implants, such as $BF_2^+$, $P^+$, $As^+$, and low energy implants such as nitrogen. Although beam line gas is shown in FIG. 12, any recipe parameter that is unused for both high and low energy implants could be used for the circuit shown in FIG. 12. The beam line gas is part of the recipe, which may be developed through the user interface shown in FIG. 1A. Because beam line gas is not used for either high or low energy implants, the recipes would normally call for beam line gas to be off. However, the inventors propose using the beam line gas parameter to select an ion gauge. Thus, the beam line gas recipe parameter now serves an important function.

Pin number 8 is a digital interface signal. The digital interface signal is low when one of the pressure sensors is to be on and high when both of the pressure sensors are to be off. Pin number 7 is the controller input for pressure sensor 2. Pin number 6 is the controller input for pressure sensor 1. If only one of the two pressure sensors (ion gauges) were to be used, the digital interface signal could simply be jumped from pin number 8 to either pin number 7 or pin number 6.

The circuit shown in FIG. 12 allows the user to select between either the first or second pressure sensor and allows the operator to select the appropriate pressure sensor automatically. The circuit shown in FIG. 12 has two delay circuits and two relays. Delay circuit 1210 is connected to relay circuit 1215, and delay circuit 1220 is connected to relay circuit 1225. Both of the delay circuits 1210 and 1220 have two inputs, for a total of four inputs. Each of these four inputs is connected to the beam line gas signal. The delay circuits 1210 and 1220 are substantially the same. However, inverters U3A and U3B cause the delay circuits to operate at different times. Transistor T2 is similar to transistor T5. However, transistor T2 is connected to a resistor R8, and transistor T5 is connected to an inverter U3A. Transistor T3 is similar to transistor T6. However, transistor T3 is connected to an inverter U3B, and transistor T6 is connected to a resistor R15. With these connections, transistor T2 is on when transistor T5 is off. Transistor T3 is off when transistor T6 is on. Because of the similarities between the two delay circuits 1210, 1220, only one will be described in detail.

Transistor T2 through the capacitor C2 and resistor R5 form a delay circuit together with the associated components. The RC time constant of C2 and R5 determines how long transistor T2 must be on before a signal is received at U5B. U5B together with R9 and T4 assure that an accurate voltage signal is output even if the input to U5B fluctuates. They also serve to control the timing of the delay circuit such that the delay does not change with changing temperature, for example.

When transistor T2 is on and a signal is eventually output through U5B, and R9 and T4, the second pressure sensor is turned on through pin 7 of the ion gauge controller. When transistor T2 is on, transistor T3 is off. Thus, transistor T3 has no effect when the delay circuit is working to activate the second pressure sensor. However, when transistor T2 is off, transistor T3 is on. The purpose of transistor T3 is to discharge the capacitor C2. In this manner, when transistor T2 is again turned on, the RC time constant will not be altered by any charge stored from a previous operation.

The delay circuit 1220 operates substantially the same as the delay circuit 1210 with the exception that the components U5A, R10 and T7 produce an on signal when the components U5B, R9 and T4 produce an off signal.

The delay circuits 1210 and 1220 are connected to the pressure sensor controller through respective relay circuits 1215 and 1225. Both relay circuits 1215 and 1225 receive the digital input signal from pin 8. When the relay circuit 1215 or 1225 receives a high signal from the delay circuit 1210 or 1220, the relay circuit 1215 or 1225 effectively passes the digital input signal from pin 8 to pin 7 or 6. The relay circuits 1215 and 1225 are used instead of a direct connection in order to provide insulation from the rest of the device. In some applications, it is certainly possible to eliminate the relay circuits 1215 and 1225.

The devices labeled U5A and U5B together form a hex buffer between each delay circuit and the associated relay circuits. The hex buffer is a logic device which outputs a predetermined voltage when an input voltage is greater than or equal to a certain voltage. For example, referring to hex buffer U5A, when pin 3 reaches a voltage greater than or equal to five volts, a five-voltage signal will be output on pin 2. FIG. 12 shows an indicator light LED2. This indicator light can be used to inform the operator which pressure sensor is operating. Alternatively, this can be done through the user interface shown in FIG. 1A. Although the pressure gauge controller has inputs for two ion gauges, it is not designed to switch between the two ion gauges. Thus, an instantaneous digital switching signal is ineffective. With the circuit shown in FIG. 12, sufficient delay is provided. The delay emulates an operator mechanically changing a jumper between pins 6 and 7. This jumper would connect one of pins 6 and 7 to pin 8.

When the pressure sensor/ion gauge controller is instructed to operate either the first or second pressure sensor, the pressure sensor controller communicates with the appropriate pressure sensor through the connector 175 or the connector 185 (see FIG. 1B), as described previously.

The invention has been described in detail with particular reference to preferred embodiments thereof and examples, but it will be understood that variations and modifications can be effected within the spirit and scope of the invention.

What is claimed is:

1. A device to implant impurities into a semiconductor wafer, comprising:
   a pressure compensation unit;
   a beam gun to shoot an ion beam at a semiconductor wafer;
   first and second ion gauges; and
   a switching device to selectively connect the first or second ion gauge to the pressure compensation unit.

2. A device to implant impurities into a semiconductor wafer according to claim 1, further comprising a current sensor to sense the number of implanted ions.

3. A device to implant impurities into a semiconductor wafer according to claim 1, wherein
   the beam gun is positioned upstream from a process chamber,
   the first ion gauge is positioned outside of the process chamber, and
   the second ion gauge is positioned within the process chamber.

4. A device to implant impurities into a semiconductor wafer according to claim 3, wherein
   the device further comprises a cryo pump to minimize the pressure within the process chamber, and
   the first ion gauge is positioned between the process chamber and the cryo pump.

5. A device to implant impurities into a semiconductor wafer according to claim 1, further comprising:

a disk faraday to receive ions from the ion gun; and
a current meter to count the number of electrons flowing to the disk faraday to neutralize the ions.

6. A device to implant impurities into a semiconductor wafer according to claim 1, wherein a portion of the ions are neutralized before reaching the semiconductor wafer.

7. A device to implant impurities into a semiconductor wafer according to claim 1, wherein
a plurality of wafers are arranged on a support disk which rotates about an axis of rotation substantially parallel to an ion beam path,
at least some of the wafers have a resist layer, and
resist outgassing occurs when the ion beam strikes the resist layer.

8. A device to implant impurities into a semiconductor wafer according to claim 7, wherein
a disk faraday receives ions from the ion gun,
a current meter counts the number of electrons flowing to the disk faraday to neutralize the ions,
the support disk has a radialy extending slot arranged among the wafers,
the ion beam travels through the slot as the support disk rotates, and
the support disk is arranged between the disk faraday and the ion gun.

9. A device to implant impurities into a semiconductor wafer according to claim 1, wherein
the chamber has a wall, and
the second ion gauge extends through the wall of the chamber.

10. A device to implant impurities into a semiconductor wafer according to claim 1, wherein
a plurality of wafers are arranged on a support disk which rotates about an axis of rotation substantially parallel to an ion beam path,
the support disk moves radially at a radial speed with respect to the ion beam, and
the radial speed is varied to control the amount of time the ion beam is focused at different radial positions on the support disk.

11. A device to implant impurities into a semiconductor wafer according to claim 10, wherein the radial speed decreases when it is determined that the number of impurities being implanted is relatively low.

12. A device to implant impurities into a semiconductor wafer according to claim 10, wherein:
the first and second ion gauges sense pressure;
a disk faraday to receive ions from the ion gun; and
the device further comprises:
a current meter to count the number of electrons flowing to the disk faraday to neutralize the ions; and
the pressure compensation unit varies the radial speed of the support disk as a function of the current sensed by the current meter and as a function of the pressure sensed by the ion gauge connected to the pressure compensation unit.

13. A device to implant impurities into a semiconductor wafer according to claim 1, wherein the first ion gauge is used for high energy implants and the second ion gauge is used for low energy implants.

14. A device to implant impurities into a semiconductor wafer, comprising:
a process chamber having a wall;
a pressure compensation unit;
a support disk to support a plurality of semiconductor wafers within the process chamber, the support disk having a radialy extending slot arranged among the wafers;
a beam gun positioned upstream from the process chamber to shoot an ion beam at the semiconductor wafers;
a cryo pump to minimize the pressure within the process chamber;
first and second ion gauges, the first ion gauge being positioned between the process chamber and the cryo pump, the second ion gauge extending through the wall of the process chamber;
a switching device to selectively connect the first or second ion gauge to the pressure compensation unit;
a disk faraday to receive ions from the ion gun after the ions travel through the slot in the support disk; and
a current meter to count the number of electrons flowing to the disk faraday to neutralize the ions.

* * * * *

UNITED STATES PATENT AND TRADEMARK OFFICE
CERTIFICATE OF CORRECTION

PATENT NO. : 7,009,193 B2 Page 1 of 1
APPLICATION NO. : 10/697644
DATED : March 7, 2006
INVENTOR(S) : Frederico Garza et al.

It is certified that error appears in the above-identified patent and that said Letters Patent is hereby corrected as shown below:

On the Title page, item (56), References Cited, Other Publications, column 2, line 1, change "Reproduciblility" to --Reproducibility--

On the Title page, item (57), Abstract, column 2, line 13, after "ion gun" delete "filter"

Column 11, line 20, change "radialy" to --radially--

Column 12, line 25, change "radialy" to --radially--

Signed and Sealed this

Fourteenth Day of November, 2006

JON W. DUDAS
*Director of the United States Patent and Trademark Office*